(12) United States Patent
Tsuyuki et al.

(10) Patent No.: US 10,498,260 B2
(45) Date of Patent: Dec. 3, 2019

(54) ELECTRIC DEVICE, PIEZOELECTRIC MOTOR, ROBOT, HAND, AND LIQUID TRANSPORT PUMP

(71) Applicant: Seiko Epson Corporation, Tokyo (JP)

(72) Inventors: Yuichiro Tsuyuki, Matsumoto (JP); Noboru Furuya, Chino (JP)

(73) Assignee: Seiko Epson Corporation (JP)

( * ) Notice: Subject to any disclaimer, the term of this patent is extended or adjusted under 35 U.S.C. 154(b) by 498 days.

(21) Appl. No.: 15/347,962

(22) Filed: Nov. 10, 2016

(65) Prior Publication Data

US 2017/0141702 A1    May 18, 2017

(30) Foreign Application Priority Data

Nov. 13, 2015  (JP) ................. 2015-222782

(51) Int. Cl.
| | |
|---|---|
| H01L 41/09 | (2006.01) |
| H02N 2/00 | (2006.01) |
| B25J 9/12 | (2006.01) |
| B25J 15/00 | (2006.01) |
| F04B 43/09 | (2006.01) |
| H05K 1/03 | (2006.01) |
| H05K 1/05 | (2006.01) |

(52) U.S. Cl.
CPC .............. *H02N 2/001* (2013.01); *B25J 9/12* (2013.01); *B25J 15/0028* (2013.01); *F04B 43/095* (2013.01); *H01L 41/0926* (2013.01); *H05K 1/0393* (2013.01); *H05K 1/05* (2013.01)

(58) Field of Classification Search
CPC ......... H02N 2/001; B25J 9/12; B25J 15/0028; F04B 43/095; H01L 41/0926; H05K 1/0393; H05K 1/05

USPC .................................................. 310/363–366
See application file for complete search history.

(56) References Cited

U.S. PATENT DOCUMENTS

| | | | |
|---|---|---|---|
| 6,515,450 B1* | 2/2003 | Kaiho ................. | H01M 2/1022 320/112 |
| 6,592,380 B2* | 7/2003 | Miyazawa ........... | H01R 12/592 439/329 |
| 2005/0024076 A1* | 2/2005 | Haji-Sheikh ......... | G01R 31/275 324/750.05 |
| 2010/0261369 A1* | 10/2010 | Satoh .................... | H01R 12/79 439/328 |
| 2010/0309641 A1* | 12/2010 | Hata ..................... | H01L 21/563 361/783 |
| 2012/0187516 A1 | 7/2012 | Sato | |
| 2013/0127302 A1 | 5/2013 | Benkert et al. | |
| 2015/0200610 A1 | 7/2015 | Yamasaki | |
| 2015/0222036 A1 | 8/2015 | Sato et al. | |

(Continued)

FOREIGN PATENT DOCUMENTS

| | | |
|---|---|---|
| CN | 102918674 A | 2/2013 |
| CN | 104821448 A | 8/2015 |

(Continued)

*Primary Examiner* — Thomas M Dougherty
(74) *Attorney, Agent, or Firm* — Harness, Dickey & Pierce, P.L.C.

(57) ABSTRACT

An electric device includes an electric component that includes an electrode terminal which includes a projection portion, and a circuit substrate that includes a connected portion which is electrically connected to the projection portion, in which the connected portion includes a recess portion that is in contact with the projection portion.

15 Claims, 16 Drawing Sheets

(56) References Cited

U.S. PATENT DOCUMENTS

| | | | |
|---|---|---|---|
| 2016/0254103 A1* | 9/2016 | Nakamura | C23C 18/1651 |
| | | | 429/211 |
| 2017/0110819 A1 | 4/2017 | Kadoguchi et al. | |

FOREIGN PATENT DOCUMENTS

| | | | | |
|---|---|---|---|---|
| JP | 03-104887 A | | 5/1991 | |
| JP | 88688 A | * | 1/1996 | ............... H03H 9/58 |
| JP | 3052615 B2 | * | 6/2000 | ............. H01L 24/81 |
| JP | 2001-203229 A | | 7/2001 | |
| JP | 2007-036009 A | | 2/2007 | |
| JP | 2007336504 A | * | 12/2007 | ............. H04R 17/00 |
| JP | 2012-156231 A | | 8/2012 | |
| JP | 2013165925 A | * | 8/2013 | ............. H01M 2/10 |
| JP | 2015-133864 A | | 7/2015 | |
| JP | 2018845886 A | * | 2/2018 | ............. H01R 12/71 |
| WO | WO-2015-136984 A1 | | 9/2015 | |

* cited by examiner

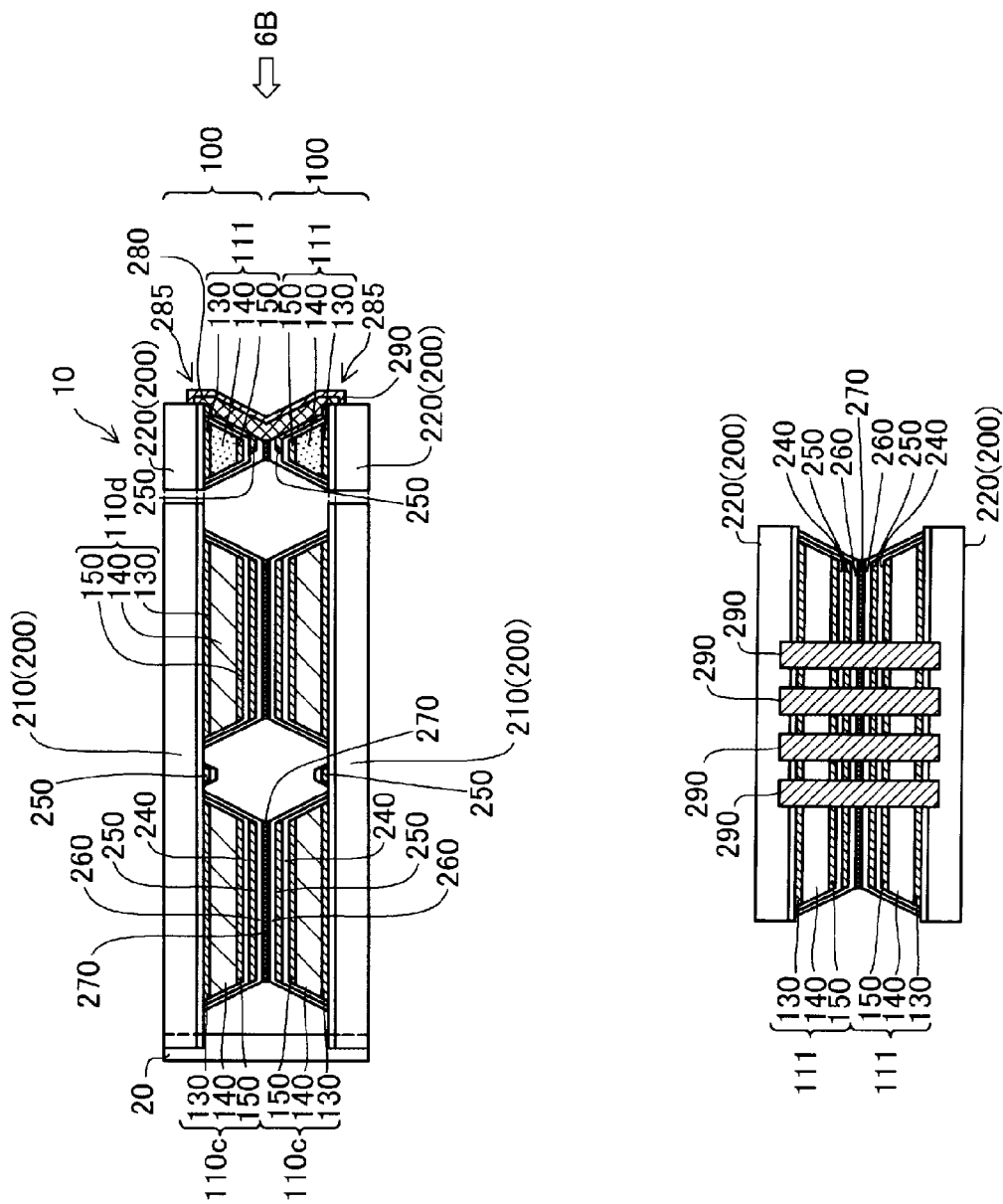

ELECTRIC DEVICE, PIEZOELECTRIC MOTOR, ROBOT, HAND, AND LIQUID TRANSPORT PUMP

BACKGROUND

1. Technical Field

The present invention relates to an electric device and various apparatuses that use the electric device.

2. Related Art

Known is an ultrasonic motor that moves a moved member using ultrasonic vibration occurring in a vibrator (for example, JP-A-2015-133864). Electrode terminals of the vibrator are electrically connected to a connected portion of a circuit substrate (flexible substrate) in the ultrasonic motor.

When the vibrator is rendered small, the area of contact between the electrode terminal and the circuit substrate is decreased, and irregularities may occur in the contact resistance between the electrode terminals. Such a problem is not limited to the ultrasonic motor and is common to other types of electric devices.

SUMMARY

An advantage of some aspects of the invention is to solve at least a part of the problems described above, and the invention can be implemented as the following aspects.

(1) According to an aspect of the invention, an electric device is provided. The electric device includes an electric component that includes an electrode terminal which includes a projection portion, and a circuit substrate that includes a connected portion which is electrically connected to the projection portion, in which the connected portion includes a recess portion that is in contact with the projection portion. According to this aspect, the connected portion includes the recess portion that is in contact with the projection portion. As a result, the area of contact between the electrode terminal and the connected portion of the circuit substrate can be increased, and irregularities can be rendered unlikely to occur in the contact resistance between electrode terminals.

(2) According to another aspect of the invention, an electric device is provided. The electric device includes an electric component that includes an electrode terminal which includes a projection portion, and a circuit substrate that includes a connected portion which is electrically connected to the projection portion, in which the Young's modulus of the projection portion is greater than the Young's modulus of the connected portion. According to this aspect, since the Young's modulus of the projection portion is greater than the Young's modulus of the connected portion of the circuit substrate, the projection portion easily intrudes into the connected portion. The area of contact between the electrode terminal and the connected portion of the circuit substrate can be increased, and irregularities can be rendered unlikely to occur in the contact resistance between electrode terminals.

(3) In the aspect of the invention, the circuit substrate may include a flexible printed substrate. The flexible printed substrate has high elasticity, and thus the projection portion easily intrudes into the connected portion. Thus, the area of contact between the electrode terminal and the connected portion of the circuit substrate can be increased, and irregularities can be rendered unlikely to occur in the contact resistance between electrode terminals.

(4) In the aspect of the invention, at least a part of the projection portion may be configured of a plating layer. With this configuration, the projection portion can be easily configured.

(5) In the aspect of the invention, the projection portion may include nickel and the connected portion may include copper. With this configuration, the projection portion easily intrudes into the connected portion.

(6) In the aspect of the invention, the projection portion may include a gold plating layer on a surface thereof. With this configuration, since the projection portion includes the gold plating layer on the surface thereof, occurrences of corrosion can be reduced, and irregularities can be rendered unlikely to occur in the contact resistance between electrode terminals.

(7) In the aspect of the invention, the electrode terminal may include a plurality of the projection portions. With this configuration, since the electrode terminal is in contact with the connected portion of the circuit substrate at the plurality of the projection portions, the total area of contact between the electrode terminal and the connected portion of the circuit substrate can be increased, and irregularities can be rendered unlikely to occur in the contact resistance between electrode terminals.

(8) In the aspect of the invention, the electric component may be a piezoelectric actuator which includes a vibrating plate which includes a vibrator.

(9) In the aspect of the invention, the electric component may be a stacked actuator in which a plurality of the piezoelectric actuators is stacked. In this case, the electric device can have large driving power.

(10) In the aspect of the invention, the electric component and the circuit substrate may be arranged in a direction in which a first imaginary plane that includes a main surface of the vibrator intersects with a second imaginary plane that includes a surface in which the electric component and the circuit substrate are connected. With this configuration, one circuit substrate can be connected to the electrode terminals of the plurality of the piezoelectric actuators of the electric device.

The invention can be implemented in various forms and, for example, can be implemented in various forms, in addition to the electric device, such as a piezoelectric actuator, a stacked actuator, a piezoelectric motor that includes the electric device, and a robot, a hand, and a liquid transport pump that include the electric device.

BRIEF DESCRIPTION OF THE DRAWINGS

The invention will be described with reference to the accompanying drawings, wherein like numbers reference like elements.

FIG. 5 is a sectional view of the piezoelectric actuator.

FIG. 6 is a descriptive diagram of the piezoelectric actuator when seen from a side thereof to which a circuit substrate is connected.

DESCRIPTION OF EXEMPLARY EMBODIMENTS

First Embodiment

Figure 1:
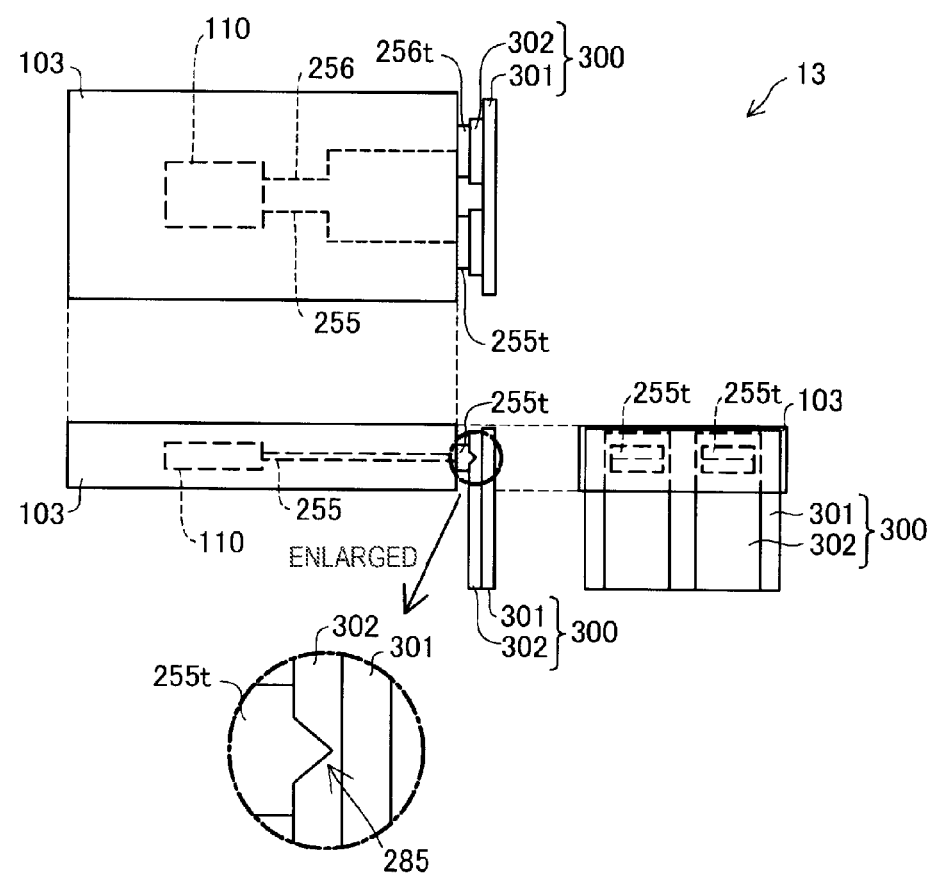
FIG. 1 is a descriptive diagram illustrating an electric device in a first embodiment.

FIG. 1 is a descriptive diagram illustrating an electric device 13 in a first embodiment. The electric device 13 includes an electric component 103 and a circuit substrate 300. The electric component 103 includes a piezoelectric element 110 as an electric circuit and wirings 255 and 256. One end portions of the wirings 255 and 256 are connected to two electrodes (not illustrated) between which a piezoelectric body of the piezoelectric element 110 is sandwiched. The other end portions of the wirings 255 and 256 include electrode terminals 255t and 256t that protrude toward the circuit substrate 300. The electrode terminals 255t and 256t are configured of, for example, nickel and include projection portions 285. The Young's modulus of nickel is 207 GPa. The Young's modulus is the proportionality constant of strain and stress in a coaxial direction within the elasticity range in which the Hooke's law holds, and is represented by $E=\sigma/\varepsilon$ when the Young's modulus, the strain, and the stress are respectively $E$, $\varepsilon$, and $\sigma$. The Young's modulus $E$ is the gradient of a straight line in an elastic deformation region in a stress-strain curve when plotted with the stress $\sigma$ on the horizontal axis and the strain on the vertical axis. A method for obtaining the stress-strain curve is as follows. Two gauge points are marked on a material, and the material is attached in a tensile testing machine (or a universal testing machine and the like) in such a manner that a tensile load is exerted thereon in the direction in which the two gauge points are lined up. A distance L between the gauge points is measured while a tensile load P is exerted on the material. The stress $\sigma$ is obtained by dividing the tensile load P by a sectional area $A_0$ between the two gauge points before deformation and thus is $\sigma=P/A_0$. The strain $\varepsilon$ is obtained by dividing an elongation $\Delta L$ ($=L-L_0$) by a distance $L_0$ between the gauge points before deformation and thus is $\varepsilon=\Delta L/L_0$. The stress $\sigma$ and the strain $\varepsilon$ are plotted on a recording paper and the like to obtain the stress-strain curve. Regarding the shape of the material (specimen) and the distance between the gauge points, refer to Japanese Industrial Standards (JIS) 22201 or International Organization for Standardization (ISO) 6892. This method is not applicable in a case where sufficient dimensions are not obtained due to the availability of the material.

The circuit substrate 300 is, for example, a flexible printed substrate and includes an FPC substrate main body 301 and multiple connected portions 302 that are arranged on the FPC substrate main body 301. The connected portions 302 are wiring electrode and are electrically connected to the projection portions 285 of the electrode terminals 255t and 256t of the electric component 103. The connected portion 302 is configured of a member that has a smaller Young's modulus than the projection portion 285 (for example, metal such as copper). The Young's modulus of copper is 110 GPa. Therefore, the Young's modulus of the projection portion 285 which is made of nickel is greater than the Young's modulus of the connected portion 302 which is made of copper. Both of the projection portion 285 and the connected portion 302 are preferably configured of metal.

According to the first embodiment, the Young's modulus of the projection portion 285 is greater than the Young's modulus of the connected portion 302. Thus, the projection portion 285 intrudes into the connected portion 302 when the electric component 103 and the circuit substrate 300 are connected by pressing the projection portion 285 to the connected portion 302. That is, a recess portion is formed in the connected portion 302. The projection portion 285 contacts the recess portion. As a result, the area of contact between the projection portion 285 and the connected portion 302 is increased, and thus irregularities can be rendered unlikely to occur in the contact resistance between the projection portion 285 and the connected portion 302. In addition, heating at a high temperature is not required when the projection portion 285 and the connected portion 302 are connected.

The circuit substrate 300 is a flexible printed substrate and thus has high elasticity. As a result, the projection portion 285 can easily intrude into the connected portion 302.

While the electric component 103 that includes the piezoelectric element 110 is used in the first embodiment, the invention is applicable to other types of electric components.

Modification Example of First Embodiment

Figure 2:
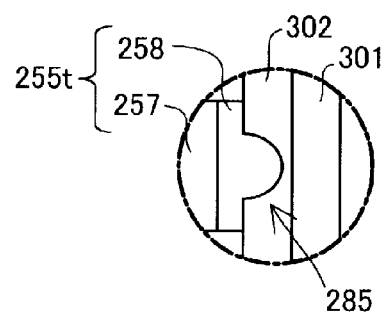
FIG. 2 is a descriptive diagram illustrating a modification example of a projection portion structure.

FIG. 2 is a descriptive diagram illustrating a modification example of a projection portion structure. FIG. 2 illustrates only a part that corresponds to an enlarged view in FIG. 1 of the part in which the projection portion 285 and the connected portion 302 are connected. The structure and the material of the electrode terminal 255t in the modification example are different from those in the first embodiment. The electrode terminal 255t of the modification example is configured of a base portion 257 and a convex connected portion 258. The base portion 257 is configured of, for example, aluminum or copper. The convex connected portion 258 is configured of, for example, a nickel plating layer and constitutes the projection portion 285. If such a structure is employed, the base portion 257 can be configured by using aluminum, copper, or the like that has a small Young's modulus and is easily worked. Since the convex connected portion 258 included in the projection portion 285 is configured of nickel that has a large Young's modulus, irregularities can be rendered unlikely to occur in the contact resistance between the projection portion 285 and the connected portion 302.

While the convex connected portion 258 is configured of a nickel plating layer in the modification example, the convex connected portion 258 (or the projection portion 285) may be configured by using conductive paste instead of the nickel plating layer. The conductive paste includes, for example, silver, and the Young's modulus of silver is 76 GPa. Therefore, aluminum (has a Young's modulus of 68 GPa), for example, may be used as the material of the connected portion 302.

Second Embodiment

Figure 3:
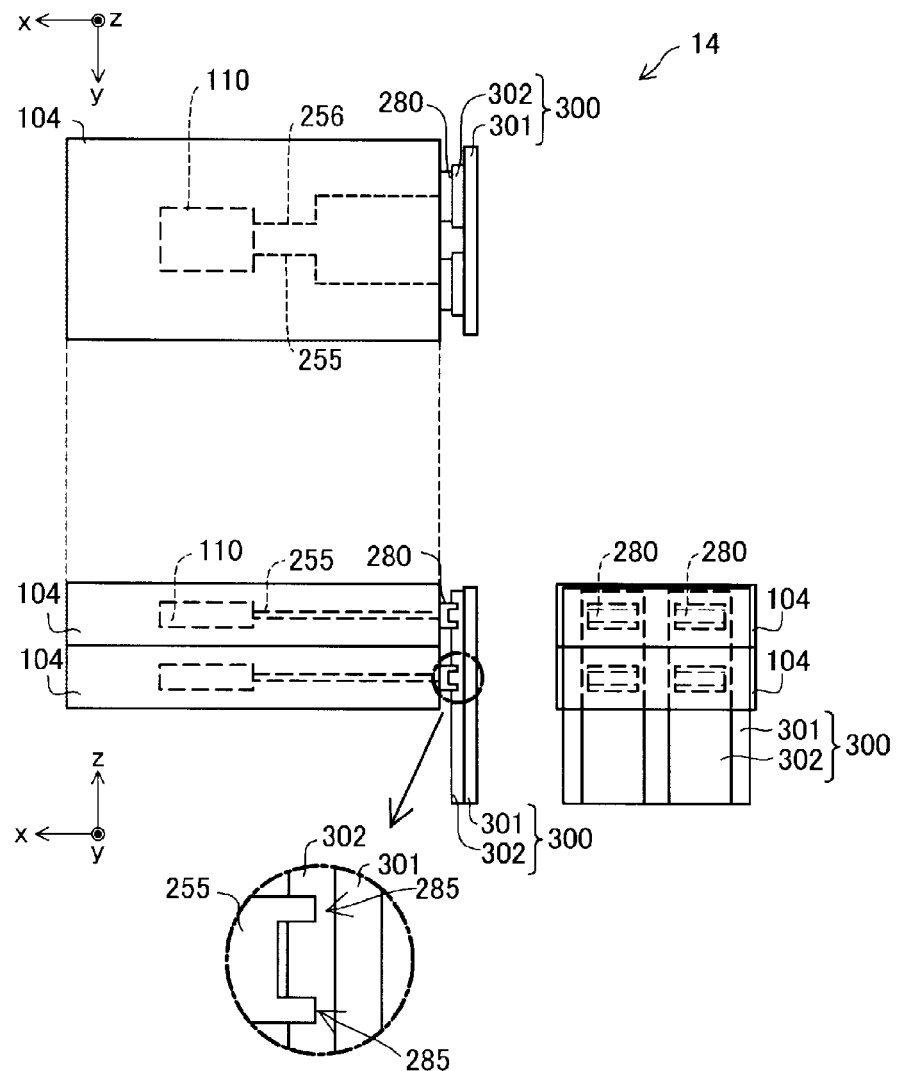
FIG. 3 is a descriptive diagram illustrating an electric device in a second embodiment.

FIG. 3 is a descriptive diagram illustrating an electric device 14 in a second embodiment. The difference from the electric device 13 of the first embodiment is the structure of the projection portion 285. While the electrode terminal 255*t* includes one projection portion 285 in the first embodiment, the electrode terminal 255*t* includes two projection portions 285 in the second embodiment. Including two projection portions 285 allows a further increase in the area of contact between the projection portions 285 and the connected portion 302, and thus irregularities can be further rendered unlikely to occur in the contact resistance between the projection portions 285 and the connected port ion 302. The electrode terminal 255*t* may include multiple projection portions 285.

The shape of the projection portion 285 adopts a rectangular shape in the second embodiment. The tip end of the projection portion 285 adopts a sharp shape in the first embodiment, and the tip end of the projection portion 285 adopts a round shape in the modification example. The shape of the projection portion 285 may adopt various shapes provided that the projection portion 285 is included.

The second embodiment includes two electric components 104, and the two electric components 104 are stacked in a z direction (the thickness direction of the electric component 104). The electric device may include multiple electric components 104.

Third Embodiment

Figure 4:
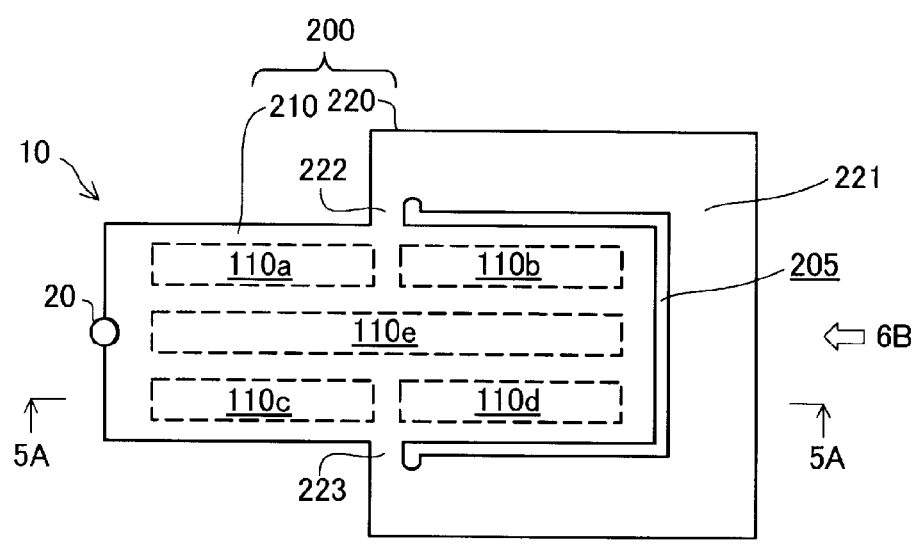
FIG. 4 is a descriptive diagram illustrating a piezoelectric actuator that is an electric component in a third embodiment.

FIG. 4 is a descriptive diagram illustrating a piezoelectric actuator 10 that is an electric component in a third embodiment. The piezoelectric actuator 10 includes piezoelectric elements 110*a*, 110*b*, 110*c*, 110*d*, and 110*e* as a vibrator, a substrate 200, and a protrusion portion 20. The substrate 200 includes a vibrating portion 210 and a support portion 220 that supports the vibrating portion 210. The vibrating portion 210 has an approximately rectangular shape in which the piezoelectric elements 110*a*, 110*b*, 110*c*, 110*d*, and 110*e* are arranged. The piezoelectric element 110*e* is arranged to have an approximately rectangular shape and is arranged to extend in the longitudinal direction of the vibrating portion 210 at the widthwise center of the vibrating portion 210. The piezoelectric elements 110*a*, 110*b*, 110*c*, and 110*d* are arranged to be positioned at four corners of the vibrating portion 210. The support portion 220 is arranged to surround approximately half of the vibrating portion 210, and end portions of the support portion 220 are connected to the vibrating portion 210 at the center of the long edge of the vibrating portion 210. The end portions of the support portion 220 connected to the vibrating portion 210 will be referred to as "first connected portion 222", and "second connected portion 223", and the part of the support portion 220 other than the first connected portion 222 and the second connected portion 223 will be referred to as "fixed portion 221". An interval 205 is configured between the vibrating portion 210 and the support portion 220. When a voltage is applied to the piezoelectric elements 110*a* to 110*e*, the piezoelectric elements 110*a* to 110*e* are expanded and contracted, and the vibrating portion 210 is vibrated. The interval 205 is configured to have a size in which the vibrating portion 210, even if vibrated, does not contact the fixed portion 221 of the support portion 220. The protrusion portion 20 is arranged on a short edge on the side of the vibrating portion 210 not surrounded by the support portion 220. The protrusion portion 20 is preferably configured of a durable material such as ceramic (for example, $Al_2O_3$).

FIG. 5 is a sectional view of the piezoelectric actuator 10 taken along 5A-5A in FIG. 4. For convenience of illustration, dimensions in the thickness direction are drawn in an exaggerated manner. The piezoelectric actuator 10 includes two piezoelectric actuator units 100, a nickel plating layer 280, and a gold plating layer 290. FIG. 4 that is described above does not illustrate the nickel plating layer 280 and the gold plating layer 290.

Each of the two piezoelectric actuator units 100 includes the substrate 200 and the five piezoelectric elements 110*a* to 110*e* (FIG. 4) arranged on the substrate 200. Since FIG. 5 is a sectional view taken along 5A-5A, FIG. 5 illustrates two piezoelectric elements 110*c* and 110*d* of the five piezoelectric elements 110*a* to 110*e* and does not illustrate the other three piezoelectric elements 110*a*, 110*b*, and 110*e*. Each of the piezoelectric elements 110*a* to 110*e* includes a first electrode 130, a piezoelectric body 140, and a second electrode 150. The piezoelectric elements 110*a* to 110*e* are arranged on each of the facing main surfaces of two substrates 200 in a region (the region of the vibrating portion 210) where the two substrates 200 overlie each other in a plan view (FIG. 4). Two piezoelectric elements that are designated by the same reference sign, for example, two piezoelectric elements 110*a*, are positioned to be seen in an overlying manner in the plan view of the two substrates 200. The same applies to the other piezoelectric elements 110*b* to 110*e*.

An insulating layer 240, a wiring layer 250, and a protective layer 260 are arranged on the piezoelectric elements 110*a* to 110*e*. The insulating layer 240 insulates the piezoelectric elements 110*a* to 110*e*. The wiring layer 250 constitutes a wiring that is used to apply voltages to the first electrodes 130 and the second electrodes 150 of the piezoelectric elements 110*a* to 110*e*. The protective layer 260 protects the piezoelectric elements 110*a* to 110*e* from external damage. The "protective layer 260" will be referred to as "cladding portion 260" as well.

The two piezoelectric actuator units 100 are arranged in such a manner that the piezoelectric elements 110*a* to 110*e* are sandwiched between the two substrates 200 and are bonded by a bond layer 270 with the substrates 200 positioned outside. That is, the cladding portions 260 of the two piezoelectric actuator units 100 are bonded by the bond layer 270, and thereby the piezoelectric actuator 10 is formed.

While the shape of the protrusion portion 20 is not described along with FIG. 4, the protrusion portion 20 has an approximately cylindrical shape and straddles the two substrates 200 as illustrated in FIG. 5. The protrusion portion 20 may have a spherical shape or an ellipsoidal shape and may be provided in each substrate 200.

The piezoelectric actuator 10 as illustrated in FIG. 5 includes, on the support portion 220, a piezoelectric element structure 111 in which the piezoelectric body 140 is sandwiched between the first electrode 130 and the second electrode 150. Two support portions 220 are arranged at an interval in a case where the piezoelectric actuator 10 does not include the piezoelectric element structure 111 on the support portion 220 of the substrate 200. The piezoelectric elements 110a to 110e are arranged between the two substrates 200 in the vibrating portion 210. The vibrating portion 210 and the support portion 220 have different thicknesses in a case where the piezoelectric element structure 111 is not included on the support portion 220. Thus, the piezoelectric actuator units 100 are not in contact in the support portion 220, and the structure may be unstable. When the piezoelectric element structure 111 is included on the support portion 220, the thicknesses of the vibrating portion 210 and the support portion 220 approximately match, and the piezoelectric actuator units 100 are in contact in the support portion 220. Thus, the structure is likely to be stable. The support portion 220 may be vibrated when the piezoelectric element structure 111 is expanded and contracted by a voltage applied thereto. Thus, the piezoelectric element structure 111 is preferably configured not to be expanded and contracted even if a voltage is applied thereto or in such a manner that a voltage is not applied to the piezoelectric body 140 thereof. For example, the two electrodes 130 and 150 between which the piezoelectric body 140 of the piezoelectric element structure 111 is sandwiched may be grounded or short-circuited.

The nickel plating layer 280 is configured to cover the wiring layer 250 in the support portion 220 and constitutes the projection portion 285 that extends out of the support portion 220 to a small extent. The gold plating layer 290 is arranged on the nickel plating layer 280. The gold plating layer 290 hinders corrosion of the nickel plating layer 280. The gold plating layer 290 is a separate member from the projection portion 285 in the present specification. Therefore, the "Young's modulus of the projection portion 285", if referred to herein, means the Young's modulus of the projection portion 285 in the absence of the gold plating layer 290. The gold plating layer 290 may be omitted in the present embodiment. A part or the entirety of the projection portion 285 may be configured of plating layers other than the nickel plating layer 280.

FIG. 6 is a descriptive diagram of the piezoelectric actuator 10 when seen from a side thereof to which the circuit substrate 300 is connected (seen in the direction of the arrow of 6B in FIG. 5). Four gold plating layers 290 are seen in FIG. 6. The four gold plating layers 290 are respectively arranged in correspondence with four wirings (described later) configured by the wiring layer 250.

Figure 7:
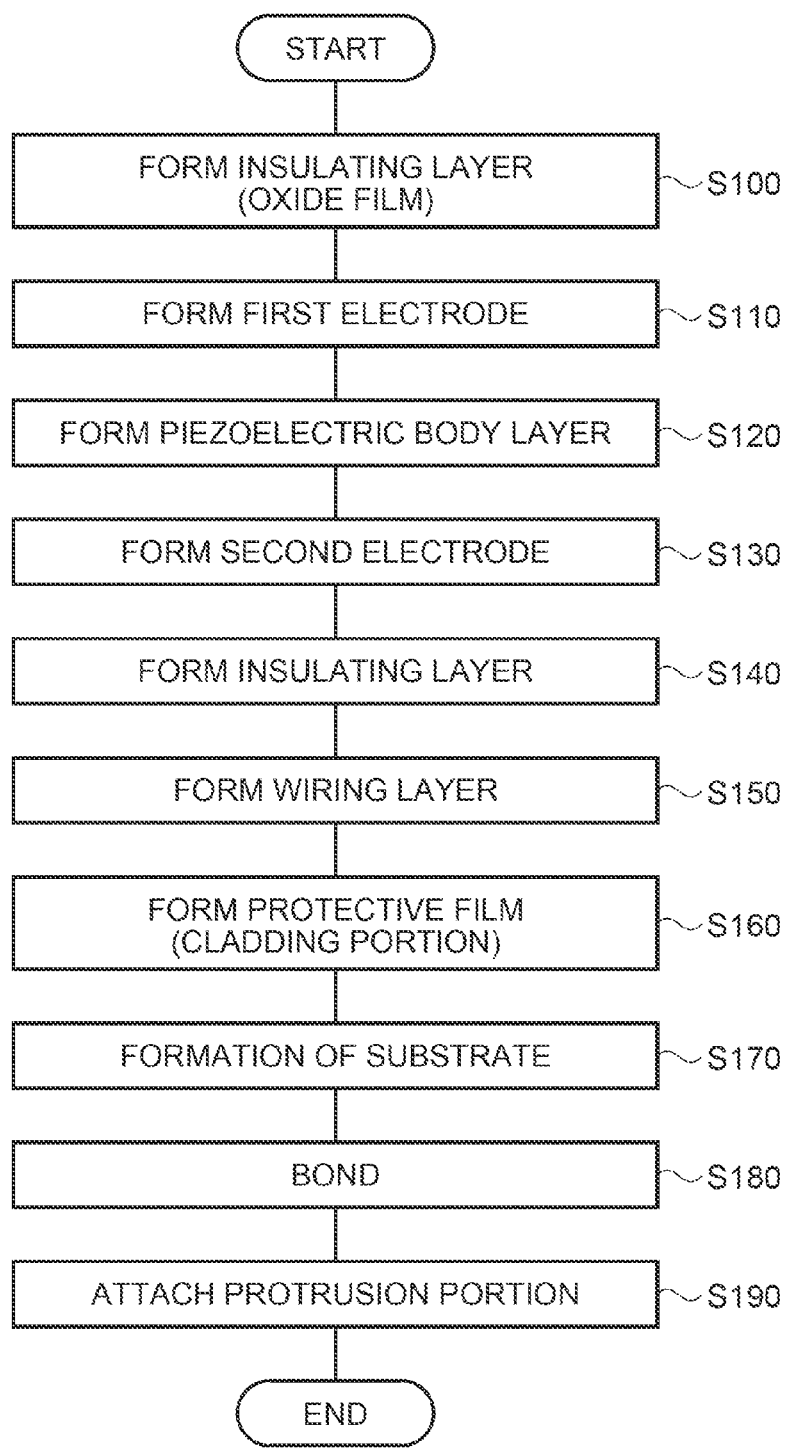
FIG. 7 is a flowchart illustrating manufacturing processes for the piezoelectric actuator.
Figure 8:
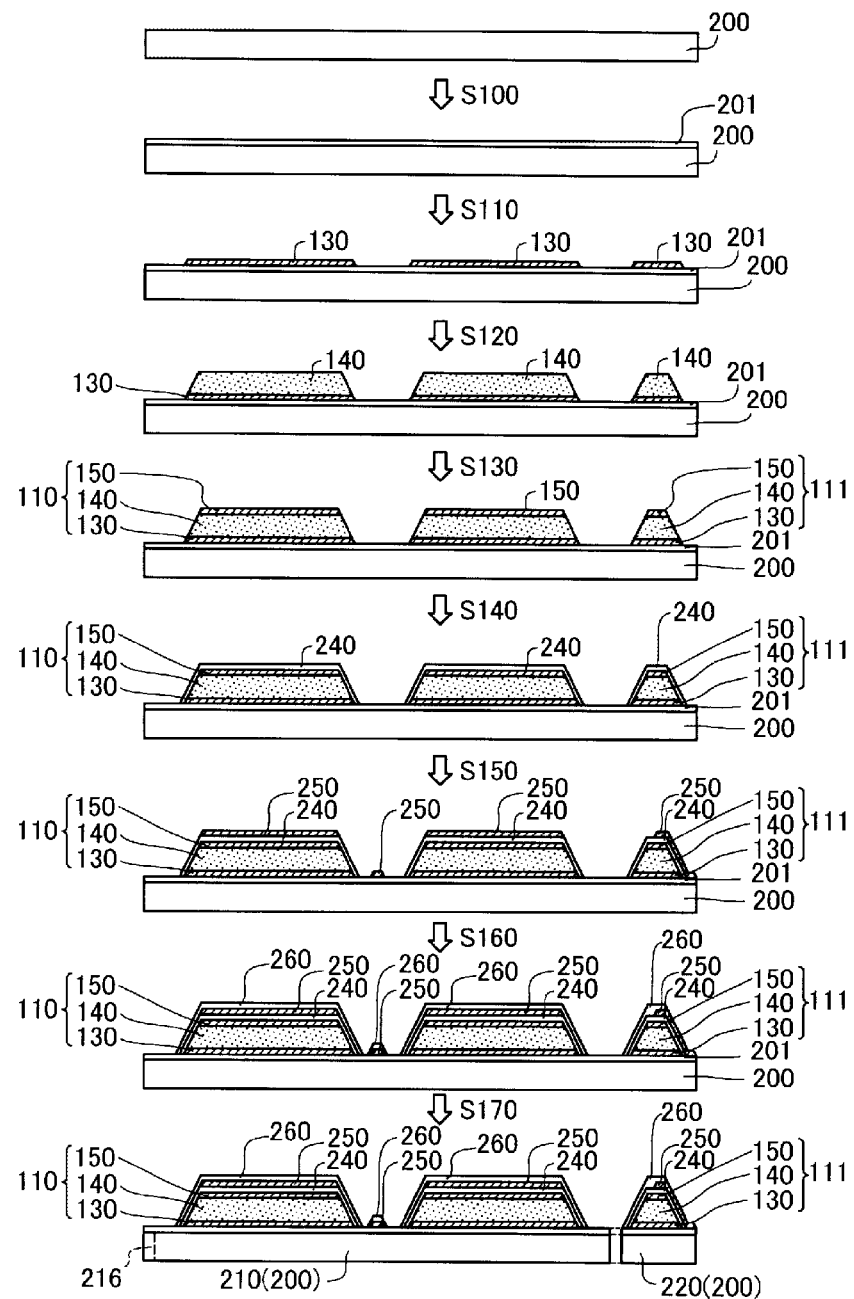
FIG. 8 is a descriptive diagram illustrating manufacturing processes for a piezoelectric actuator unit.

FIG. 7 is a flowchart illustrating manufacturing processes for the piezoelectric actuator. FIG. 8 is a descriptive diagram illustrating manufacturing processes for the piezoelectric actuator unit. In Step S100, an insulating layer 201 is formed on the substrate 200. An Si wafer, for example, can be used as the substrate 200. The piezoelectric actuator unit 100 may be formed in multiple quantities on one Si wafer. An $SiO_2$ layer, for example, that is formed by thermal oxidation of the surface of the substrate 200 can be used as the insulating layer 201. An organic material such as alumina ($Al_2O_3$), acryl, and polyimide can be used as the insulating layer 201. The process of forming the insulating layer 201 may be omitted in a case where the substrate 200 is an insulating body.

In Step S110, the first electrode 130 is formed and patterned. Any material having high conductivity, such as aluminum (Al), nickel (Ni), gold (Au), platinum (Pt), iridium (Ir), and copper (Cu), may be used as the material of the first electrode 130. The first electrode 130 can be formed by, for example, sputtering and can be patterned by, for example, etching.

In Step S120, the piezoelectric body 140 is formed on the first electrode 130 and is patterned. Any material exhibiting a piezoelectric effect, such as ceramic that adopts the $ABO_3$ perovskite structure, may be used as the material of the piezoelectric body 140. For example, lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, and lead scandium niobate may be used as the ceramic that adopts the $ABO_3$ perovskite structure. Materials other than ceramic that exhibit a piezoelectric effect, such as polyvinylidene fluoride and quartz crystal, may be used as well.

The piezoelectric body 140 may be formed by using, for example, the sol-gel method. That is, a sol-gel solution as a piezoelectric body material is dripped onto the substrate 200 (first electrode 130), and the substrate 200 is rotated at a high speed to form a thin film of the sol-gel solution on the first electrode 130. Then, calcination is performed at a temperature of 200° C. to 300° C. to form a first layer of the piezoelectric body material on the first electrode 130. Then, the cycle of sol-gel solution dripping, high-speed rotation, and calcination is repeated multiple times to form a piezoelectric body layer to a desired thickness on the first electrode 130. The thickness of one layer of the piezoelectric body formed in one cycle, though depending on the viscosity of the sol-gel solution and the speed of rotation of the substrate 200, is a thickness of approximately 50 nm to 150 nm. After the piezoelectric body layer is formed to a desired thickness, sintering is performed at a temperature of 600° C. to 1,000° C. to form the piezoelectric body 140. If the thickness of the piezoelectric body 140 after sintering is set to fall within the range of greater than or equal to 50 nm (0.05 μm) and less than or equal to 20 μm, the piezoelectric actuator 10 can be realized to have a small size. If the thickness of the piezoelectric body 140 is greater than or equal to 0.05 μm, sufficiently large force can be generated in response to expansion and contraction of the piezoelectric body 140. If the thickness of the piezoelectric body 140 is less than or equal to 20 μm, sufficiently large force can be generated even if the voltage applied to the piezoelectric body 140 is less than or equal to 600 V. As a result, a drive circuit (not illustrated) that is used to drive the piezoelectric actuator 10 can be configured of inexpensive elements. The thickness of the piezoelectric body may be greater than or equal to 400 nm. In this case, large force can be generated by the piezoelectric elements. The temperatures and the times of calcination and sintering are examples and are appropriately chosen according to the piezoelectric body material.

Performing sintering after a thin film of the piezoelectric body material is formed with the use of the sol-gel method has advantages over a related art sintering method that mixes powder of raw materials and performs sintering, in that (a) the thin film is easily formed, (b) crystallization is easily performed with aligned lattice directions, and (c) the breakdown voltage of the piezoelectric body can be improved.

Patterning of the piezoelectric body 140 in the first embodiment is performed in Step S120 by ion milling that uses an argon ion beam. Instead of patterning using ion milling, patterning may be performed by any other patterning methods (for example, dry etching that uses chlorine-based gas).

In Step S130, the second electrode 150 is formed on the piezoelectric body 140 and is patterned. Forming and patterning of the second electrode 150 can be performed by etching in the same manner as the first electrode 130.

In Step S140, the insulating layer 240 is formed on the second electrode 150 and is patterned to form a contact hole. The contact hole is not illustrated in FIG. 8. In Step S150, the wiring layer 250 is formed on the insulating layer 240 by using copper or brass, and the wiring layer 250 is patterned to form wirings.

Figure 9:
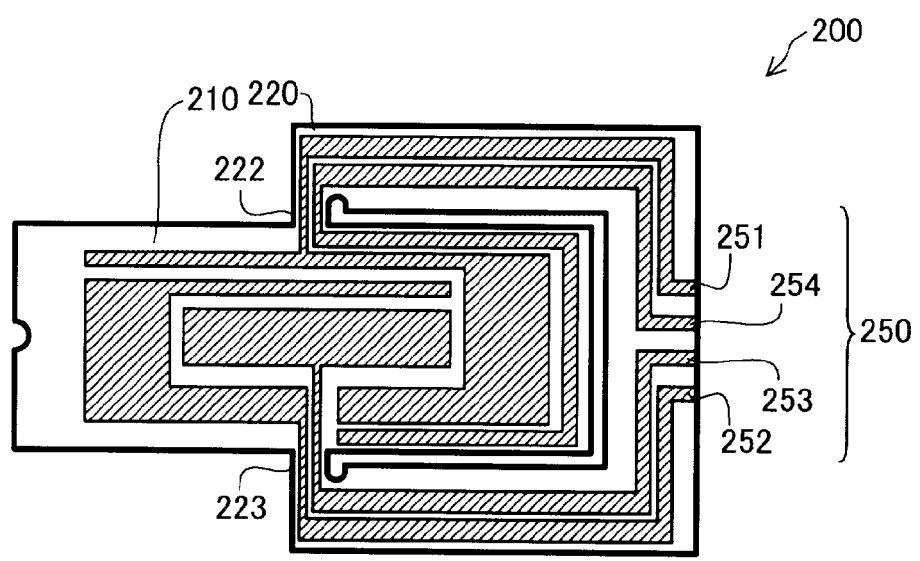
FIG. 9 is a descriptive diagram illustrating a wiring pattern provided by a wiring electrode.

FIG. 9 is a descriptive diagram illustrating a wiring pattern provided by the wiring layer 250. The wiring layer 250 includes four wirings 251, 252, 253, and 254. The wirings 251 to 254 are formed to reach the vibrating portion 210 by passing over the connected portions 222 and 223 from the top of the fixed portion 221. The first wiring 251 is connected to the second electrodes 150 of the piezoelectric elements 110a and 110d (FIG. 1) on the vibrating portion 210. Similarly, the second wiring 252 is connected to the second electrodes 150 of the piezoelectric elements 110b and 110c on the vibrating portion 210. The third wiring 253 is connected to the second electrode 150 of the piezoelectric element 110e on the vibrating portion 210. The fourth wiring 254 is connected to the first electrodes 130 of the piezoelectric elements 110a, 110b, 110c, 110d, and 110e on the vibrating portion 210. The wirings 251 to 254 are connected to the circuit substrate on the support portion 220. The wirings 251 to 254 are not connected to the piezoelectric element structure 111 on the fixed portion 221. As understood from FIG. 9, the four wirings 251 to 254 protrude on a side of the support portion 220 to which the substrate 300 is connected (right side in FIG. 9). The four gold plating layers 290 that are described along with FIG. 6 are formed to cover the four wirings 251 to 254 through the nickel plating layer 280.

In Step S160, the protective layer 260 (cladding portion 260) is formed. The cladding portion 260 is formed of silicone resin such as junction coating resin (JCR). Instead of JCR, resin materials such as epoxy and polyimide may be used to form the cladding portion 260.

In Step S170, etching is performed to form the interval 205 between the vibrating portion 210 and the support portion 220 and to form a recess portion that is used to attach the protrusion portion 20, along with forming the shapes of the individual substrates 200.

Figure 10:
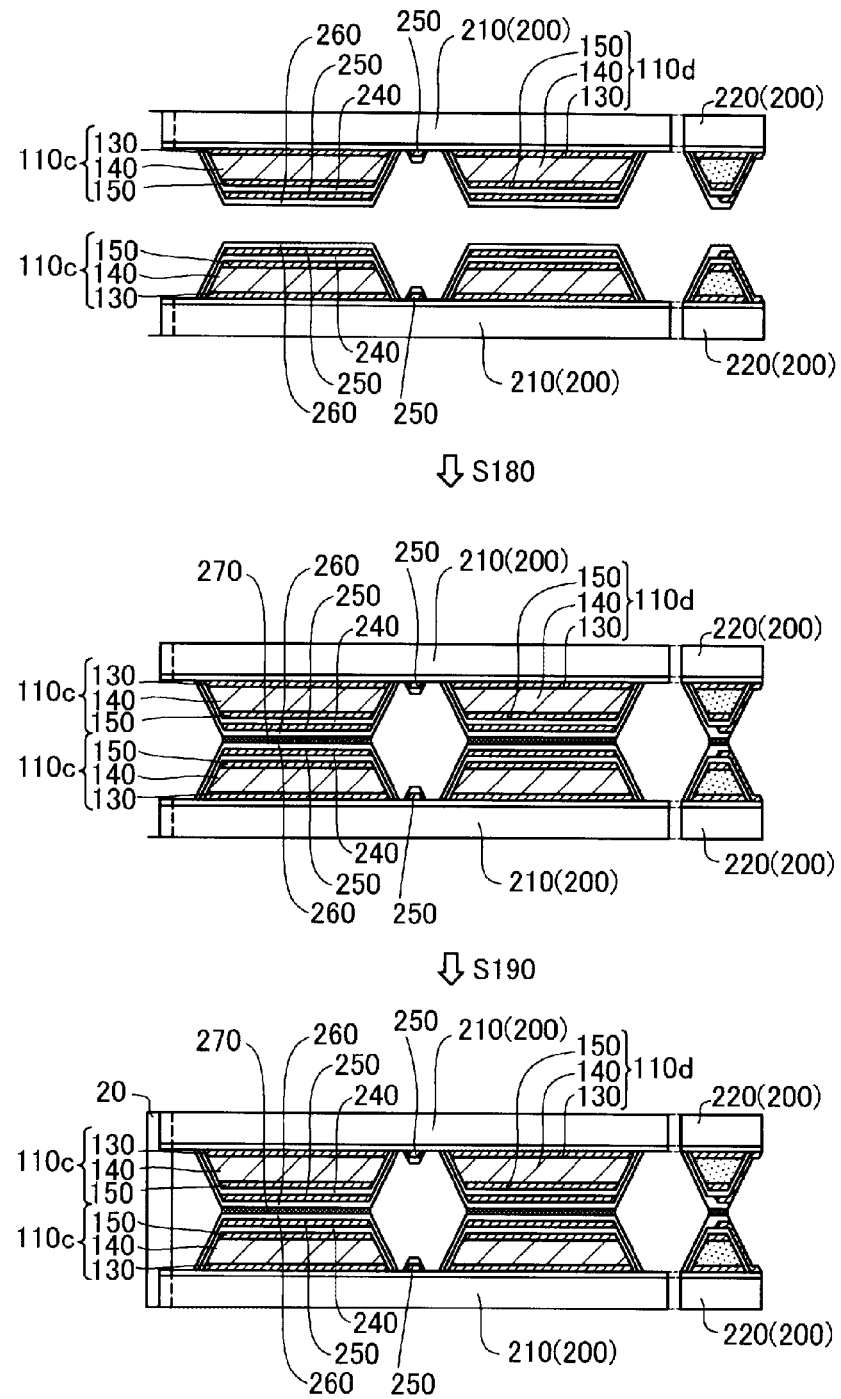
FIG. 10 is a descriptive diagram illustrating processes of manufacturing the piezoelectric actuator using two piezoelectric actuator units.

FIG. 10 is a descriptive diagram illustrating processes of manufacturing the piezoelectric actuator 10 using the two piezoelectric actuator units 100. In Step S180, the two piezoelectric actuator units 100 are arranged in such a manner that members designated by the same reference sign are in plane symmetry with the substrates 200 positioned outside and the piezoelectric elements 110a to 110e directed inward. Then, the cladding portions 260 of the two piezoelectric actuator units 100 are bonded by using the bond layer 270. The piezoelectric elements 110a to 110e are covered with the cladding portion 260 and are sandwiched between the two substrates 200 and thus are unlikely to experience external damage caused by dust. In Step S190, the protrusion portion 20 is bonded to the recess portion by adhesive.

Figure 11:
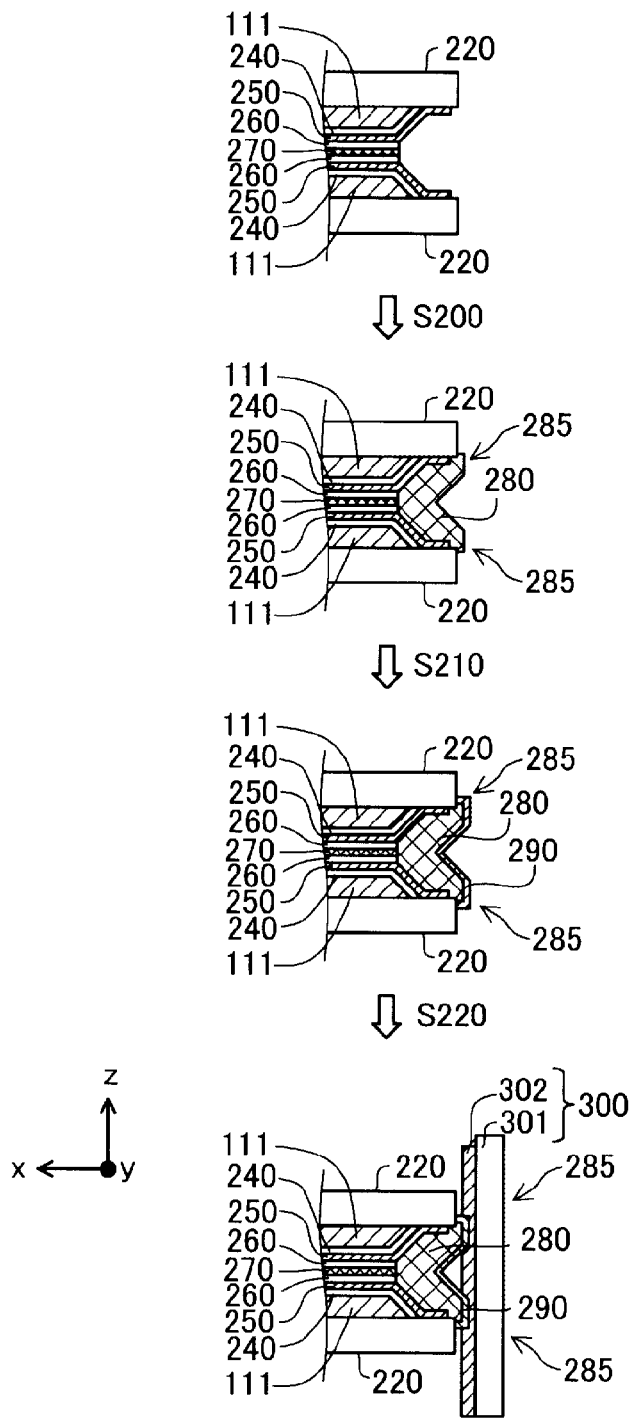
FIG. 11 is a descriptive diagram illustrating processes of connecting the piezoelectric actuator and a substrate.

FIG. 11 is a descriptive diagram illustrating processes of connecting the piezoelectric actuator and the circuit substrate. For convenience of illustration, FIG. 11 illustrates the first electrode 130, the piezoelectric body 140, and the second electrode 150 (FIG. 5) as the piezoelectric element structure 111 without separation. In Step S200, the nickel plating layer 280 is formed on the wiring layer 250 by using the electroless nickel-phosphorus plating method. Specifically, first, an end portion of the piezoelectric actuator 10 is immersed in a catalyst solution that includes palladium ions. Since the wiring layer 250 is formed of copper or brass, a part of copper is replaced by palladium, and palladium metal is adsorbed to the wiring layer 250.

Next, the end portion of the piezoelectric actuator 10 is immersed in an electroless nickel-phosphorus plating liquid. The electroless nickel-phosphorus plating liquid includes nickel ions ($Ni^{2+}$) and hypophosphite ions ($H_2PO_2^-$). Nickel ions ($Ni^{2+}$) and hypophosphite ions ($H_2PO_2^-$) cause an oxidation-reduction reaction described in Equation (1) below with palladium as a catalyst, and reduced nickel is precipitated on the wiring layer 250. Since nickel is precipitated along the wiring layer 250, the nickel has a shape including the projection portion 285 that protrudes to the outer edge side from the substrate 200 along the substrate 200 (support portion 220). Since the wiring layer includes the four wirings 251 to 254 as described above, four nickel plating layers 280 are formed. The nickel may include phosphorus when precipitated.

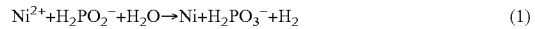

$$Ni^{2+}+H_2PO_2^-+H_2O \rightarrow Ni+H_2PO_3^-+H_2 \qquad (1)$$

In Step S210, the gold plating layer 290 is formed on the nickel plating layer 280. In Step S220, the piezoelectric actuator 10 is bonded to the circuit substrate 300. The circuit substrate 300 has a structure in which the connected portions 302 are formed on the FPC substrate main body 301. The connected portion 302 is formed of a material (for example, copper) that has a smaller Young's modulus than the projection portion 285 formed in the nickel plating layer 280. The projection portion 285 is intruded into the connected portion 302 of the circuit substrate 300 by pressing the projection portion 285 to the circuit substrate 300, and thereby the piezoelectric actuator 10 and the circuit substrate 300 are bonded and electrically connected. At this point, a first imaginary plane that includes the main surface of the vibrator (the piezoelectric elements 110a to 110e) is the xy plane, and a second imaginary plane that includes the surface in which the piezoelectric actuator 10 (electric component) and the circuit substrate 300 are connected is the yz plane. The xy plane intersects with the yz plane. That is, the first imaginary plane that includes the main surface of the vibrator (the piezoelectric elements 110a to 110e) intersects with the second imaginary plane that includes the surface in which the electric component (piezoelectric actuator 10) and the circuit substrate 300 are connected. Then, the projection portion 285 is pressed in the direction normal to the connected portion 302 of the circuit substrate 300, and thus irregularities can be rendered unlikely to occur in the contact resistance. One circuit substrate 300 may connect multiple piezoelectric actuators 10.

Figure 12:
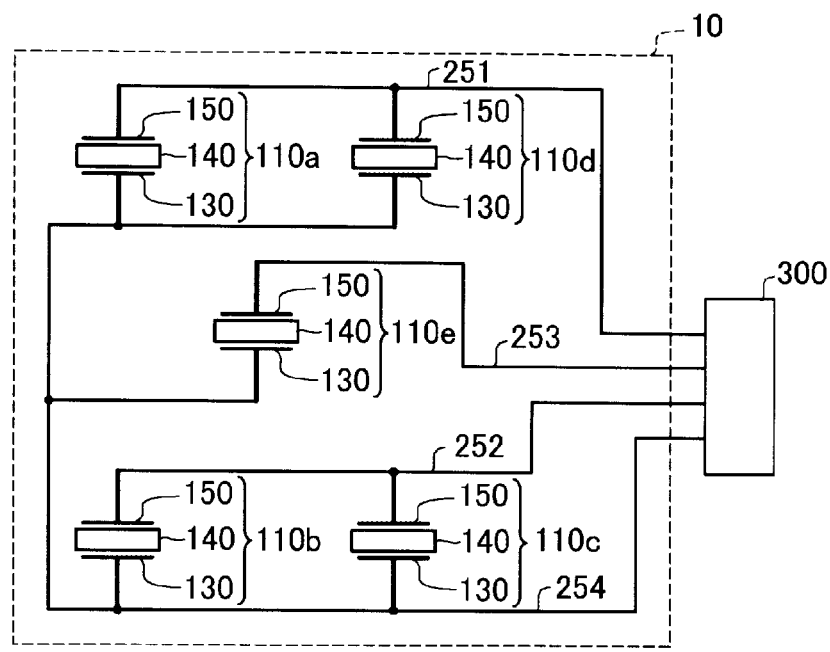
FIG. 12 is a descriptive diagram illustrating an equivalent circuit of the piezoelectric actuator.

FIG. 12 is a descriptive diagram illustrating an equivalent circuit of the piezoelectric actuator 10. While the piezoelectric actuator 10 includes two piezoelectric actuator units 100, FIG. 12 illustrates only one piezoelectric actuator unit 100. As understood from FIG. 12, the first electrodes 130 of the five piezoelectric elements 110a to 110e are connected to the wiring 254 and are connected to the circuit substrate 300. The second electrodes 150 of the piezoelectric elements 110a and 110d are connected to the wiring 251 and are connected to the circuit substrate 300. The second electrodes 150 of the piezoelectric elements 110b and 110c are connected to the wiring 252 and are connected to the circuit substrate 300. The second electrode 150 of the piezoelectric element 110e is connected to the wiring 253 and is connected to the circuit substrate 300. That is, the piezoelectric elements 110a to 110e are divided into three groups. A first group includes two piezoelectric elements 110a and 110d. A second group includes two piezoelectric elements 110b and 110c. A third group includes only one piezoelectric element 110e. The piezoelectric elements 110a and 110d of the first group are connected in parallel with each other and are connected to the circuit substrate 300. The piezoelectric elements 110b and 110c of the second group are connected in parallel with each other and are connected to the circuit substrate 300. Large voltages can be applied to each of the piezoelectric elements 110a to 110d when parallel connection is made. The piezoelectric element 110e of the third group is connected to the circuit substrate 300 alone. The piezoelectric elements 110a and 110d of the first group may be connected in series. In this case, the directions of polarization of the piezoelectric elements 110a and 110d when voltages are applied are preferably the same. The piezoelectric elements 110b and 110c of the second group may be connected in series as well. Capacitance can be decreased when serial connection is made.

Applying a periodically changing alternating current voltage or an undulating voltage from the circuit substrate 300 between the first electrode 130 and the second electrode 150 of a predetermined piezoelectric element, for example, the piezoelectric elements 110a and 110d of the first group, of the five piezoelectric elements 110a to 110e causes the piezoelectric actuator 10 to be subjected to ultrasonic vibration and allows a rotor (a driven body; a driven member) that is in contact with the protrusion portion 20 to be rotated in a predetermined direction of rotation. The "undulating voltage" means a voltage obtained by adding a DC offset to an alternating current voltage. The voltage (electric field) of the undulating voltage is unidirectional from one electrode to another electrode. The direction of a current is preferably a direction from the second electrode 150 to the first electrode 130 rather than a direction from the first electrode 130 to the second electrode 150. Applying an alternating current voltage or an undulating voltage between the first electrode 130 and the second electrode 150 of the piezoelectric elements 110b and 110c of the second group allows the rotor which is in contact with the protrusion portion 20 to be rotated in the opposite direction. That is, the piezoelectric actuator 10 functions as a piezoelectric motor.

Figure 13:
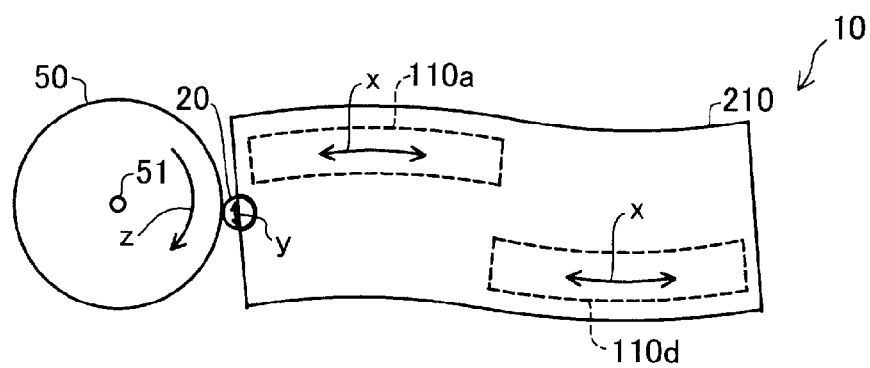
FIG. 13 is a descriptive diagram illustrating an example of operation of the piezoelectric actuator.

FIG. 13 is a descriptive diagram illustrating an example of operation of the piezoelectric actuator 10. The support portion 220 is not illustrated for convenience of illustration. The protrusion portion 20 of the piezoelectric actuator 10 is in contact with the circumference of a rotor 50 that is a driven member. An alternating current voltage or an undulating voltage is applied to the two piezoelectric elements 110a and 110d of the first group in the example illustrated in FIG. 13, and the piezoelectric elements 110a and 110d are expanded and contracted in the direction of an arrow x in FIG. 13. In response thereto, the vibrating portion 210 of the piezoelectric actuator 10 is bent in the plane of the vibrating portion 210 and is deformed into a meander shape (S shape), and the tip end of the protrusion portion 20 reciprocates in the direction of an arrow y or moves elliptically. As a result, the rotor 50 rotates in a predetermined direction z (a clockwise direction in FIG. 13) around a center 51 thereof. The rotor 50 rotates in the opposite direction in a case where the circuit substrate 300 applies an alternating current voltage or an undulating voltage to the two piezoelectric elements 110b and 110c (FIG. 12) of the second group. If an alternating current voltage or an undulating voltage is applied to the piezoelectric element 110e at the center, the piezoelectric actuator 10 is expanded and contracted in the longitudinal direction. Thus, larger force may be exerted on the rotor 50 from the protrusion portion 20. Such operation of the piezoelectric actuator 10 is disclosed in JP-A-2004-320979 (or corresponding U.S. Pat. No. 7,224,102), the content of disclosure of which is incorporated herein by reference.

According to the third embodiment described heretofore, the first imaginary plane that includes the main surface of the vibrator (the piezoelectric elements 110a to 110e) intersects with the second imaginary plane that includes the surface in which the electric component (piezoelectric actuator 10) and the circuit substrate 300 are connected, and the projection portion 285 is pressed in the direction normal to the connected portion 302 of the circuit substrate 300. Thus, irregularities can be rendered unlikely to occur in the contact resistance.

Fourth Embodiment

Figure 14:
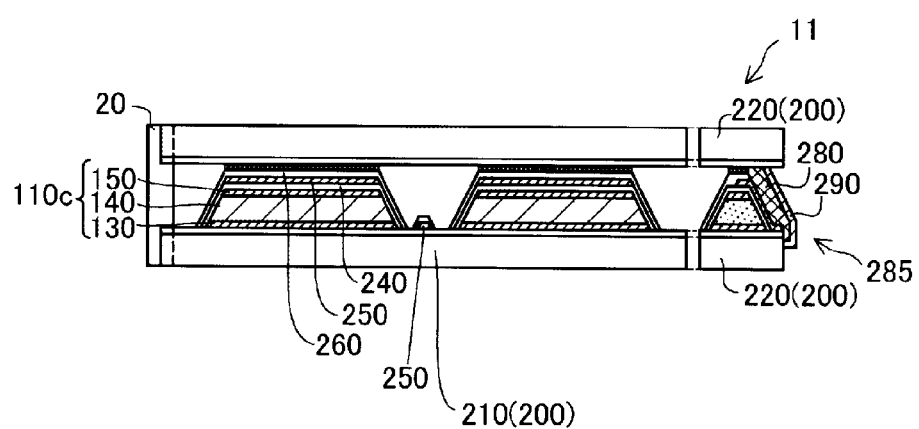
FIG. 14 is a descriptive diagram illustrating a piezoelectric actuator of a fourth embodiment.

FIG. 14 is a descriptive diagram illustrating a piezoelectric actuator 11 of a fourth embodiment. While the piezoelectric actuator 10 of the third embodiment includes two piezoelectric actuator units 100, the piezoelectric actuator 11 of the fourth embodiment includes only one piezoelectric actuator unit 100 and, instead of the second piezoelectric actuator unit 100 of the third embodiment, includes the substrate 200 on which piezoelectric elements are not arranged. That is, the piezoelectric elements 110a to 110e of the first piezoelectric actuator unit 100 are sandwiched between the substrate 200 of the first piezoelectric actuator unit 100 and the substrate 200 on which piezoelectric elements are not arranged. According to this embodiment, the piezoelectric actuator 11 in which one electrode terminal includes one projection portion 285 can be configured.

Fifth Embodiment

Figure 15:
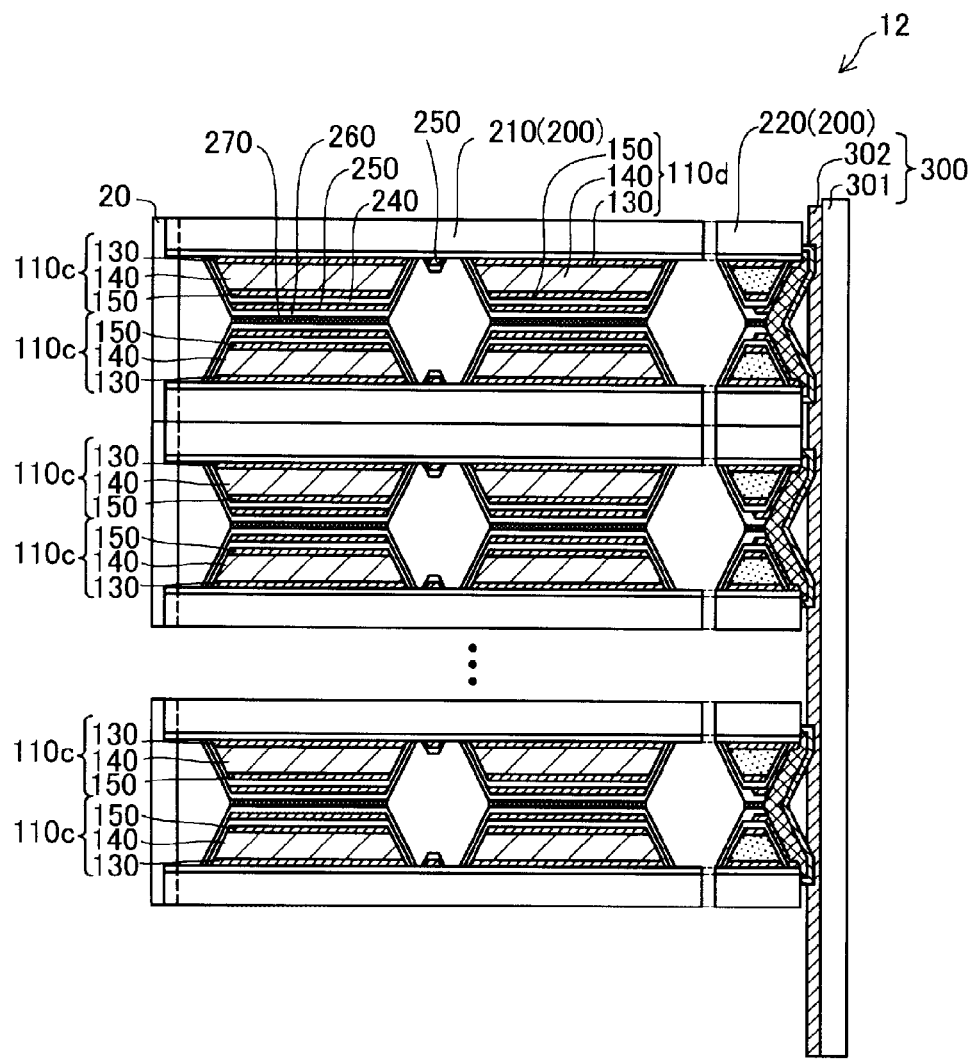
FIG. 15 is a descriptive diagram illustrating a stacked actuator of a fifth embodiment.

FIG. 15 is a descriptive diagram illustrating a stacked actuator 12 of a fifth embodiment. The third embodiment is described as including only one piezoelectric actuator 10. The piezoelectric actuator 10 of the third embodiment may be stacked in multiple quantities in the direction normal to the substrate 200 to configure the stacked actuator 12. The stacked actuator 12 can have large driving power since the stacked actuator 12 includes multiple piezoelectric actuators 10. One circuit substrate 300 may be connected to the multiple piezoelectric actuators 10 in the fifth embodiment. While the piezoelectric actuator 10 of the third embodiment is stacked in multiple quantities in the fifth embodiment, the piezoelectric actuator 11 of the fourth embodiment may be stacked in multiple quantities.

Other Embodiments

The piezoelectric actuator 10 described above can exert large force on the driven member using resonance and is applicable to various devices. The piezoelectric actuator 10 can be used as a drive device in various apparatuses such as a robot (includes an electronic component transport apparatus (IC handler) as well), a pump for medication administration, a calendar advancing apparatus for a timepiece, and a printing apparatus (for example, a paper feeding mechanism; the piezoelectric actuator 10 is not applicable to a head since a piezoelectric actuator used in the head does not cause a vibrating plate to resonate). Hereinafter, representative embodiments will be described.

Figure 16:
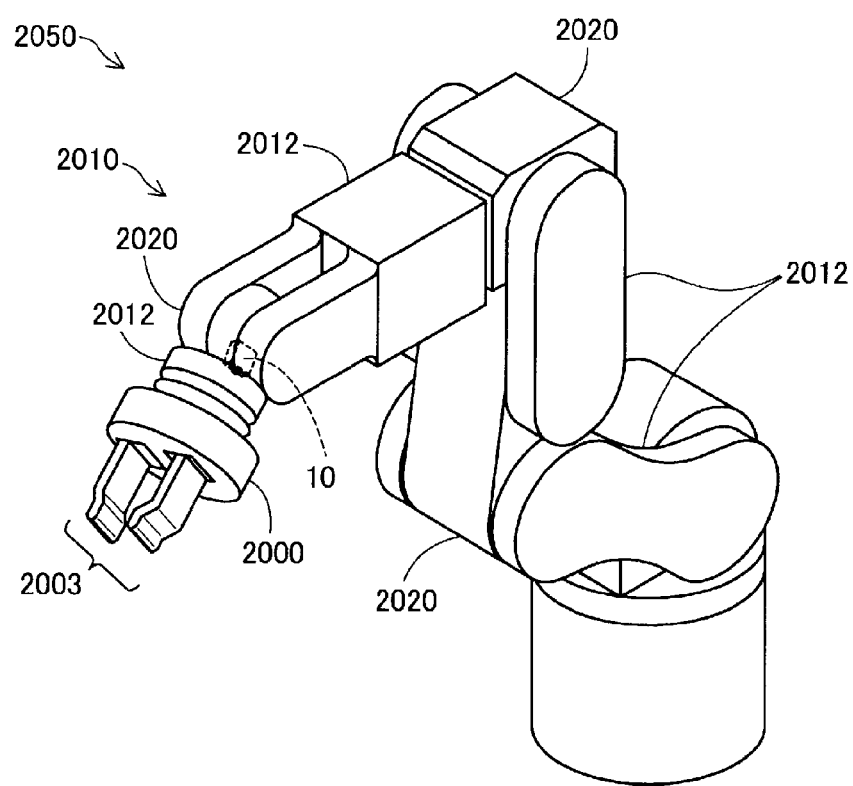
FIG. 16 is a descriptive diagram illustrating one example of a robot that uses a piezoelectric actuator.

FIG. 16 is a descriptive diagram illustrating one example of a robot 2050 that uses the piezoelectric actuator 10 described above. The robot 2050 includes an arm 2010 (referred to as "arm unit" as well) that includes multiple link units 2012 (referred to as "link members" as well) and multiple joint units 2020 that provide pivotable or bendable connection between the link units 2012. The piezoelectric actuator 10 described above is incorporated in each joint unit 2020. The joint units 2020 may be pivoted or bent any angle by using the piezoelectric actuator 10. A hand 2000 is connected to the tip end of the arm 2010. The hand 2000 includes a pair of clasping units 2003. The piezoelectric actuator 10 is incorporated in the hand 2000 as well. An object may be clasped by opening and closing the clasping units 2003 using the piezoelectric actuator 10. The piezoelectric actuator 10 is provided between the hand 2000 and the arm 2010 as well. The hand 2000 may be rotated with respect to the arm 2010 by using the piezoelectric actuator 10.

Figure 17:
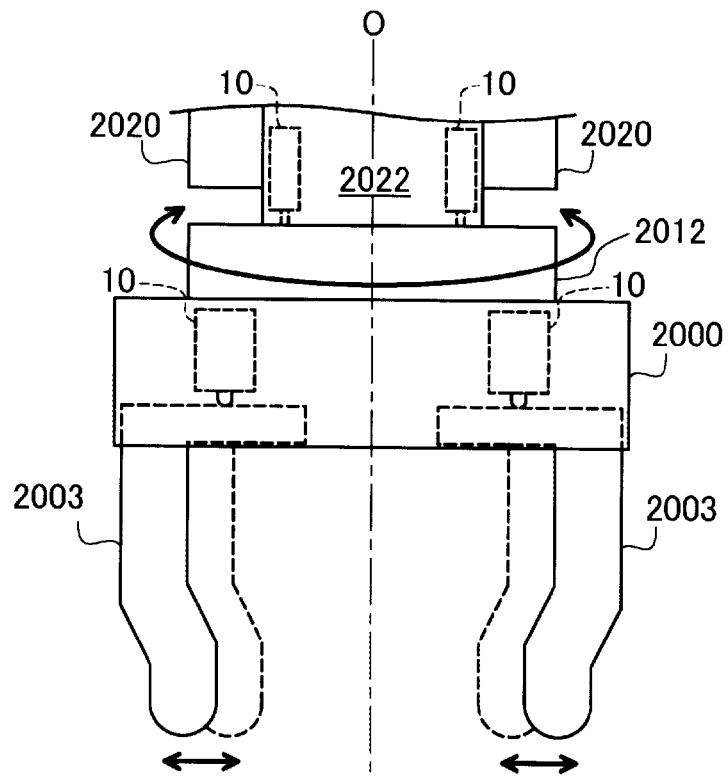
FIG. 17 is a descriptive diagram illustrating a hand that uses a piezoelectric actuator.

FIG. 17 is a descriptive diagram of a wrist part of the robot 2050 illustrated in FIG. 16. The joint units 2020 of the wrist pinch a wrist pivoting unit 2022, and the link unit 2012 of the wrist is attached to the wrist pivoting unit 2022 in a pivotable manner around a central axis O of the wrist pivoting unit 2022. The wrist pivoting unit 2022 includes the piezoelectric actuator 10, and the piezoelectric actuator 10 pivots the link portion 2012 of the wrist and the hand 2000 around the central axis O. Multiple clasping units 2003 are erected on the hand 2000. A base portion of the clasping unit 2003 is movable in the hand 2000. The piezoelectric actuator 10 is mounted in a root part of the clasping unit 2003. Thus, the clasping unit 2003 can be moved by operating the piezoelectric actuator 10 to clasp a target object.

The robot is not limited to a single-arm robot. The piezoelectric actuator 10 is also applicable to a multi-arm robot that includes two or more arms. Power lines that supply power to various devices such as a force sensor and a gyrosensor, signal lines that transmit signals, and the like are included in the joint units 2020 of the wrist and in the hand 2000 in addition to the piezoelectric actuator 10, and a significantly large number of wirings are required. Therefore, it is significantly difficult to arrange wirings in the joint units 2020 and the hand 2000. However, a drive current of the piezoelectric actuator 10 of the embodiment described above can be rendered smaller than that of a typical electric motor or a piezoelectric drive device of the related art. Thus, wirings may be arranged in a small space such as the joint units 2020 (particularly, the joint units at the tip end of the arm 2010) and the hand 2000.

While the robot 2050 that includes the hand 2000 is illustratively described above, the hand 2000 may be configured as not only a component of the robot 2050 but also a single product.

Figure 18:
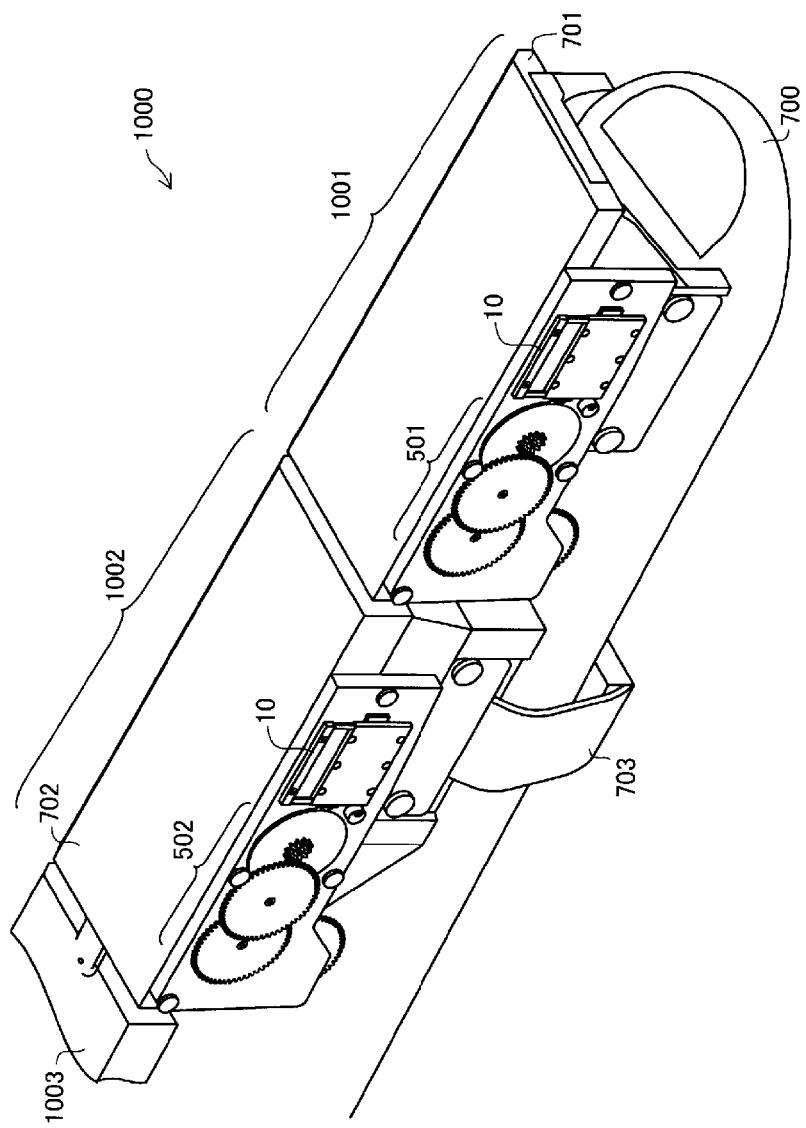
FIG. 18 is a descriptive diagram illustrating a finger assist apparatus that uses a piezoelectric actuator.

FIG. 18 is a descriptive diagram illustrating a finger assist apparatus 1000 that uses the piezoelectric actuator 10 described above. The finger assist apparatus 1000 includes a first finger assist unit 1001, a second finger assist unit 1002, and a base member 1003 and is mounted on a finger 700. The first finger assist unit 1001 includes the piezoelectric actuator 10, a speed reducer 501, and a finger support portion 701. The second finger assist unit 1002 includes the piezoelectric actuator 10, a speed reducer 502, a finger support portion 702, and a band 703. The first finger assist unit 1001 has approximately the same configuration as the second finger assist unit 1002 except for the band 703. The band 703 fixes the second finger assist unit 1002 from the belly side of the finger 700. The band 703 is provided in the first finger assist unit 1001 as well, though not illustrated in FIG. 18. The finger assist apparatus 1000 assists bending and stretching of the finger 700 using the piezoelectric actuator 10. While the finger assist apparatus 1000 is described as assisting bending and stretching of the finger 700 in the present embodiment, a hand of a robot may be used instead of the finger 700, and the finger assist apparatus 1000 may be integrated with the hand. In this case, the hand is driven to be bent and stretched by the piezoelectric actuator 10.

Figure 19:
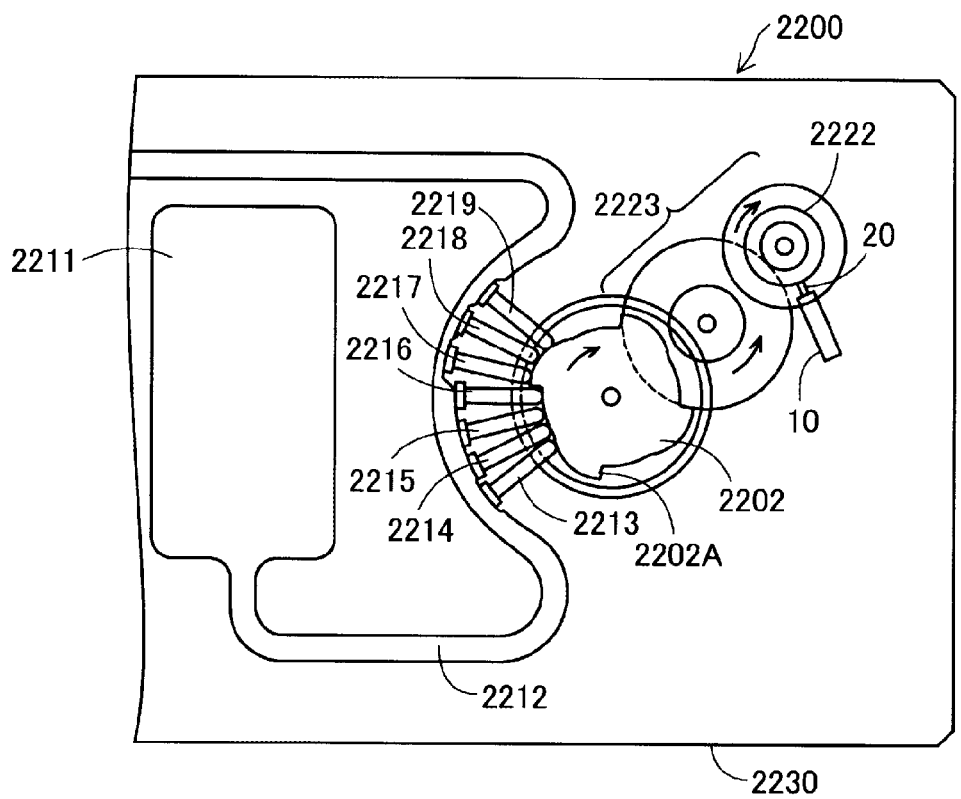
FIG. 19 is a descriptive diagram illustrating one example of a liquid transport pump that uses a piezoelectric actuator.

FIG. 19 is a descriptive diagram illustrating one example of a liquid transport pump 2200 that uses the piezoelectric actuator 10 described above. A reservoir 2211, a tube 2212, the piezoelectric actuator 10, a rotor 2222, a speed reducing transmission mechanism 2223, a cam 2202, and multiple fingers 2213, 2214, 2215, 2216, 2217, 2218, and 2219 are provided in a case 2230 of the liquid transport pump 2200. The reservoir 2211 is an accommodation unit that is used to accommodate transport target liquid. The tube 2212 is a tube that is used to transport liquid carried out of the reservoir 2211. The protrusion portion 20 of the piezoelectric actuator 10 is provided in a pressed state to a side surface of the rotor 2222, and the piezoelectric actuator 10 rotationally drives the rotor 2222. The force of rotation of the rotor 2222 is transmitted to the cam 2202 through the speed reducing transmission mechanism 2223. The fingers 2213 to 2219 are members that are used to occlude the tube 2212. When the cam 2202 rotates, a protrusion portion 2202A of the cam 2202 presses the fingers 2213 to 2219 in order in an outwardly radial direction. The fingers 2213 to 2219 occlude the tube 2212 in order from the upstream side (reservoir 2211 side) in the direction of transport. Accordingly, liquid in the tube 2212 is transported in order to the downstream side. This allows realization of the liquid transport pump 2200 that may accurately transport a minute amount of liquid and has a small size. The arrangement of each member is not limited to the illustration. A configuration that does not include members such as fingers and occludes the tube 2212 with a ball and the like provided in the rotor 2222 may be used as well. The liquid transport pump 2200 described above can be used in, for example, a medication administering apparatus that administers liquid medication such as insulin to a human body. Since the drive current is rendered smaller than that of the piezoelectric drive device of the related art by using the piezoelectric actuator 10 of the embodiments described above, power consumption of the medication administering apparatus can be reduced. Therefore, the liquid transport pump 2200 is particularly effective in a case where the medication administering apparatus is battery driven.

While embodiments of the invention are described heretofore on the basis of several examples, the embodiments of the invention described above are intended for better understanding of the invention and do not limit the invention. It is apparent that the invention may be modified or improved to the extent not departing from the gist and the claims thereof and includes equivalents thereof.

The entire disclosure of Japanese Patent Application No. 2015-222782, filed Nov. 13, 2015 is expressly incorporated by reference herein.

What is claimed is:
1. An electric device comprising:
  a first piezoelectric actuator configured with a first vibrator, a first substrate supporting the first vibrator, and a first piezoelectric element;
  a second piezoelectric actuator configured with a second vibrator, a second substrate supporting the second vibrator, and a second piezoelectric element;

a nickel plating layer contacting the first substrate and the second substrate, the nickel plating layer having a projection, and a circuit substrate that includes a connecting member, the connecting member having a recess, wherein the first piezoelectric element and the second piezoelectric element are disposed between the first substrate and the second substrate, the first piezoelectric actuator and the second piezoelectric actuator are bonded to each other by an adhesive, the projection of the nickel plating layer is located at a position overlapping the first substrate when viewed in a stacking direction of the first substrate, the nickel plating layer, and the second substrate, and the projection of the nickel plating layer and the recess of the connecting member are physically and electrically connected to each other.

2. An electric device comprising:

a first piezoelectric actuator configured with a first vibrator, a first substrate supporting the first vibrator, and a first piezoelectric element;

a second piezoelectric actuator configured with a second vibrator, a second substrate supporting the second vibrator, and a second piezoelectric element;

a nickel plating layer contacting the first substrate and the second substrate, the nickel plating layer having a projection; and a circuit substrate that includes a connecting member, wherein the first piezoelectric element and the second piezoelectric element are disposed between the first substrate and the second substrate, the first piezoelectric actuator and the second piezoelectric actuator are bonded to each other by an adhesive, the projection of the nickel plating layer is located at a position overlapping the first substrate when viewed in a stacking direction of the first substrate, the nickel plating layer, and the second substrate, the projection of the nickel plating layer and the connecting member are physically and electrically connected to each other, and wherein a Young's modulus of the projection is greater than a Young's modulus of the connecting member.

3. The electric device according to claim 1, wherein the circuit substrate includes a flexible printed substrate.

4. The electric device according to claim 1, wherein the connecting member includes copper.

5. The electric device according to claim 1, wherein an outer surface of the projection includes a gold plating layer.

6. The electric device according to claim 1, wherein the projection is configured with a plurality of the projections.

7. The electric device according to claim 1, wherein a first plane along which the first piezoelectric actuator extends and a second plane along which the circuit substrate extends intersect each other.

8. A piezoelectric motor comprising:
the electric device according to claim 1; and
a driven member abutting the first piezoelectric actuator,
wherein the driven member is driven by the first piezoelectric actuator.

9. A piezoelectric motor comprising:
the electric device according to claim 2; and
a driven member abutting the first piezoelectric actuator,
wherein the driven member is driven by the first piezoelectric actuator.

10. A robot comprising:
the electric device according to claim 1; and
a link member connecting two movable members,
wherein the link member is driven by the first piezoelectric actuator.

11. A robot comprising:
the electric device according to claim 2; and
a link member connecting two movable members,
wherein the link member is driven by the first piezoelectric actuator.

12. A hand comprising:
the electric device according to claim 1; and
a clasping member configured to clasp an object,
wherein the clasping member is driven by the final piezoelectric actuator.

13. A liquid transport pump comprising:
the electric device according to claim 2; and
a clasping member configured to clasp an object,
wherein the clasping member is driven by the final piezoelectric actuator.

14. A liquid transport pump comprising:
the electric device according to claim 1;
a reservoir in which a liquid is stored;
a liquid flow path connected to the reservoir;
a mechanism abutting the liquid flow path; and
a driven member abutting the first piezoelectric actuator,
wherein the driven member moves the mechanism so as to transport the liquid from the reservoir via and liquid flow path.

15. A liquid transport pump comprising:
the electric device according to claim 2;
a reservoir in which a liquid is stored;
a liquid path connected to the reservoir;
a mechanism abutting the liquid flow path; and
a driven member abutting the first piezoelectric actuator,
wherein the driven member moves the mechanism so as to transport the liquid from the reservoir via the liquid flow path.

* * * * *